(12) United States Patent
Hamzeh (10) Patent No.: US 8,638,653 B2
(45) Date of Patent: Jan. 28, 2014

(54) ADAPTIVE TRANSMISSIONS FOR OPTIMIZED APPLICATION DELIVERY IN WIRELESS NETWORKS

(75) Inventor: Belal Hamzeh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/057,205

(22) Filed: Mar. 27, 2008

(65) Prior Publication Data

US 2009/0245083 A1 Oct. 1, 2009

(51) Int. Cl.
*H04J 9/00* (2006.01)
*H04L 5/04* (2006.01)

(52) U.S. Cl.
USPC ........................................ 370/204

(58) Field of Classification Search
USPC ................. 370/349, 334, 344, 319, 333
See application file for complete search history.

(56) References Cited

U.S. PATENT DOCUMENTS

| 7,590,060 B2* | 9/2009 | Miceli ........................... 370/230 |
| 7,697,522 B2* | 4/2010 | Kliger et al. ................... 370/389 |
| 2002/0183020 A1 | 12/2002 | Zhu et al. |
| 2004/0184571 A1* | 9/2004 | Currivan et al. .............. 375/346 |
| 2004/0196801 A1 | 10/2004 | Hiramatsu |
| 2005/0159166 A1 | 7/2005 | Jonsson et al. |
| 2006/0133533 A1 | 6/2006 | Khandekar et al. |
| 2006/0165125 A1* | 7/2006 | Fushimi et al. ................ 370/474 |
| 2006/0171385 A1* | 8/2006 | Itou et al. ...................... 370/389 |
| 2006/0245417 A1 | 11/2006 | Conner et al. |
| 2006/0258291 A1* | 11/2006 | Nakata et al. .............. 455/67.11 |
| 2007/0025468 A1 | 2/2007 | Li |
| 2007/0223469 A1 | 9/2007 | Chandra et al. |
| 2007/0230326 A1* | 10/2007 | Pandoh et al. ................. 370/208 |
| 2008/0037540 A1* | 2/2008 | Ngo et al. ...................... 370/392 |
| 2008/0161035 A1* | 7/2008 | Tomioka et al. ........... 455/550.1 |
| 2008/0192726 A1* | 8/2008 | Mahesh et al. ................. 370/349 |
| 2008/0317014 A1* | 12/2008 | Veselinovic et al. .......... 370/380 |
| 2009/0016334 A1* | 1/2009 | Forsberg et al. .............. 370/389 |
| 2009/0067557 A1* | 3/2009 | Zhengang et al. ............ 375/346 |
| 2009/0104927 A1 | 4/2009 | Tounai et al. |

FOREIGN PATENT DOCUMENTS

| CN | 1369155 A | 9/2002 |
| CN | 101981830 | 2/2011 |
| DE | 112009000769 | 2/2011 |
| EP | 1983670 A1 | 10/2008 |

(Continued)

OTHER PUBLICATIONS

International Search Report/Written Opinion for Patent Application No. PCT/US2009/037954, mailed Jul. 31, 2009, 10 pages.

(Continued)

*Primary Examiner* — Huy D Vu
*Assistant Examiner* — Adnan Baig
(74) *Attorney, Agent, or Firm* — Thorpe North & Western, LLP (57) ABSTRACT

Methods and devices of the invention relate to sending information over a wireless communications channel using an adaptive frame structure (AFS) having unequal error protection. Unequal error protection relates to a first data region of the frame being modulated with a first modulation and coding scheme (MCS) and a second data region of the frame being modulated with a different MCS typically with a higher modulation order. The first data region, modulated with a lower order MCS, may include critical data such as error checking and header/router information while the second region may include data payload for loss tolerant applications such as voice over Internet protocol (VoIP).

10 Claims, 5 Drawing Sheets

Adaptive Frame Structure for Lossless Tolerant Data Transmission (56) References Cited

FOREIGN PATENT DOCUMENTS

| GB | 2472153 | 1/2011 |
|---|---|---|
| JP | 2004-233253 | 8/2004 |
| JP | 2007-67615 | 3/2007 |
| JP | 2007-194867 | 8/2007 |
| JP | 11-215136 | 10/2011 |
| WO | 02/06986 A2 | 1/2002 |
| WO | 2008/057406 A2 | 5/2008 |
| WO | 2009/120626 A1 | 10/2009 |

OTHER PUBLICATIONS

International Preliminary Report on Patentability received for PCT Patent Application No. PCT/US2009/037954, mailed on Oct. 7, 2010, 5 pgs.

Office Action, Great Britain Application No. 1015109.0, mailed Jan. 23, 2012, 2 pages.

Office Action received for Japanese application No. 2010-546147, mailed Dec. 4, 2012, four pages, including two pages of English translation.

Office Action received for Japanese Patent Application No. 2010-546147, mailed on May 21, 2013, 3 pages of Office Action including 2 pages of English Translation.

Office Action received for Chinese Patent Application No. 200980110639.2, mailed on Jan. 28, 2013, 22 pages of Office Action including 14 pages of English translation.

* cited by examiner

Fig. 1

Adaptive Frame Structure for Lossless Data Transmission

Fig. 2

Adaptive Frame Structure for Lossless Tolerant Data Transmission

ADAPTIVE TRANSMISSIONS FOR OPTIMIZED APPLICATION DELIVERY IN WIRELESS NETWORKS

BACKGROUND OF THE INVENTION

Due to the increasing uses for broadband communications, it is becoming more important to be able to provide high speed telecommunication services to subscribers which are relatively inexpensive as compared to existing cable and land line technologies. As a result, there has been much focus on using wireless mediums for broadband communications and there is an ongoing effort to improve efficiency and/or capacity for high bandwidth wireless communications.

Existing wireless networks presently support a heterogeneous set of applications with varying requirements and capabilities. For example, broadband wireless access (BWA) networks are expected to support file transfer protocol (FTP), web browsing, voice-over-Internet-protocols (VoIP), video and gaming applications, etc. The number of applications supported in wireless networks is expected to increase with the increasing number of emerging services. Accordingly efficient resource utilization for handling various applications traffic over wireless networks and increasing system capacity is desirable for successful deployment of BWA networks.

BRIEF DESCRIPTION OF THE DRAWING

Aspects, features and advantages of embodiments of the present invention will become apparent from the following description of the invention in reference to the appended drawing in which like numerals denote like elements and in which.

DETAILED DESCRIPTION OF THE INVENTION

While the example embodiments are described herein in relation to wireless wide area networks (WWANs) utilizing orthogonal frequency division multiplexing (OFDM) or orthogonal frequency division multiple access (OFDMA) modulation, the embodiments of present invention are not limited thereto and, for example, can be implemented in other types of networks using other modulation schemes where suitably applicable. For example, the inventive embodiments can be applied to other types of wireless networks where similar advantages may be obtained such as wireless local area networks (WLANs), wireless personal area networks (WPANs) and/or wireless metropolitan area networks (WMANs).

The following inventive embodiments may be used in a variety of applications including transmitters and/or receivers of a radio system. Radio systems specifically included within the scope of the present invention include, but are not limited to, network interface cards (NICs), network adaptors, mobile stations, base stations, access points (APs), gateways, bridges, hubs and cellular radiotelephones. Further, the systems within the scope of the invention may include cellular telephone systems, satellite systems, personal communication systems (PCS), two-way radio systems, two-way pagers, personal computers (PCs) and related peripherals, personal digital assistants (PDAs), personal computing accessories and all existing and future arising systems which may be related in nature and to which the principles of the inventive embodiments could be suitably applied.

Figure 1:
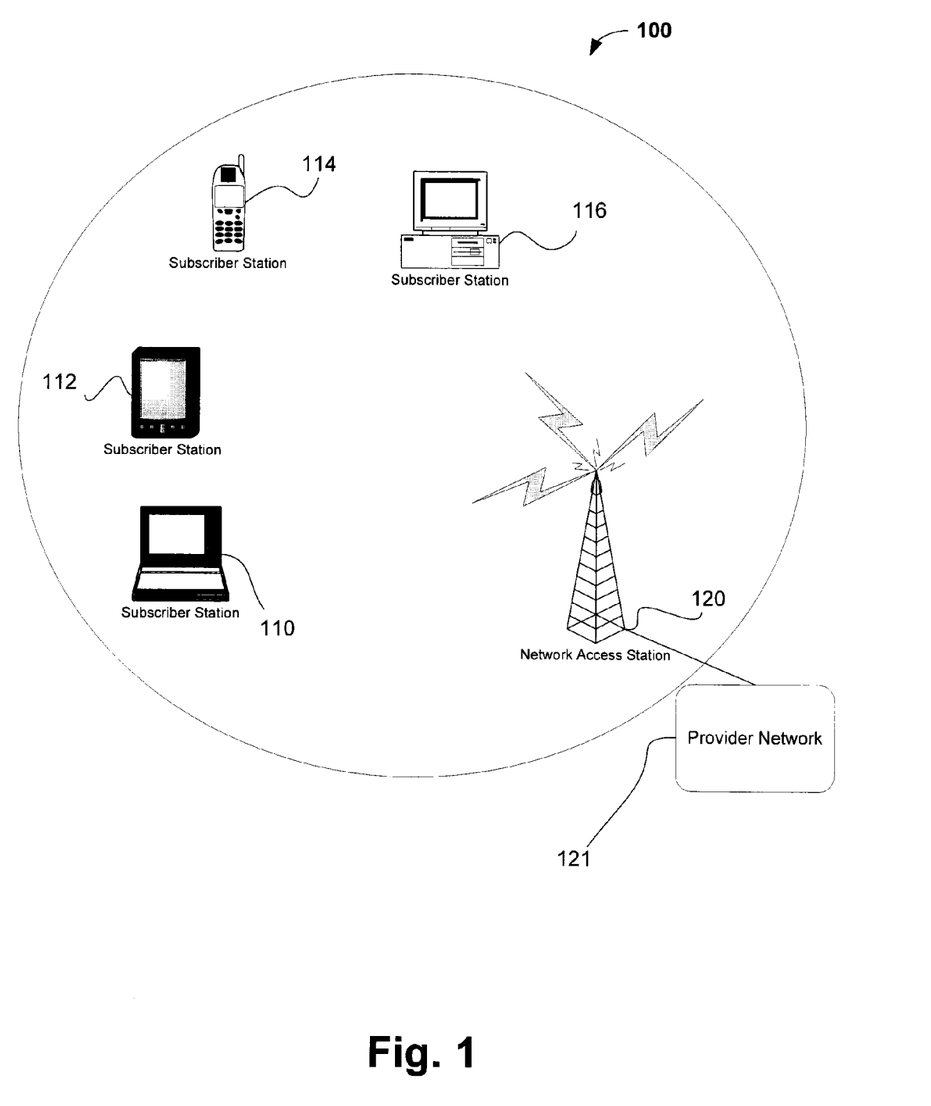
FIG. 1 is diagram of an example wireless network according to various embodiments.

Turning to FIG. 1, a wireless communication network 100 according to various inventive embodiments may be any wireless system capable of facilitating wireless access between a provider network (PN) 121 and one or more subscriber stations 110-116 such as one or more mobile and/or fixed client devices. For example, network 100 may be configured to use one or more protocols specified by the Institute of Electrical and Electronics Engineers (IEEE) 802.11 a, b, g or n standards such as IEEE 802.11a-1999; IEEE 802.11b-1999/Cor1-2001; IEEE 802.11g-2003 (collectively, IEEE 802.11-2007); and/or IEEE 802.11n (the proposed amendment to the IEEE 802.11-2007 currently in draft form) or in the IEEE 802.16 standards for broadband wireless access (BWA) such as IEEE 802.16-2005 and/or related future standards although the inventive embodiments are not limited in this respect. Alternatively or in addition, network 100 may use protocols compatible with a $3^{rd}$ Generation Partnership Project (3GPP) Long Term Evolution (LTE) mobile phone network or any protocols for WPANs or WWANs In the IEEE 802.16 standards (sometimes colloquially referred to as WiMAX, an acronym that stands for Worldwide Interoperability for Microwave Access), two principle communicating wireless network nodes are defined including the Base Station (BS) (e.g., network access station 120) and the Subscriber Station (SS) (e.g., subscriber stations 110, 112, 114 and 116). The functional equivalent for base station 110 in WLANs is referred to as an access point (AP) and subscriber stations 110-116 might be referred to as a station or (STA). However, the terms base station and subscriber station are used in a generic manner throughout this specification and their denotation in this respect is not intended to limit the inventive embodiments to any particular type of network or protocol.

In the example configuration of FIG. 1, communications between base station 120 and subscriber stations 110-116 and/or potentially between the subscriber stations themselves may be facilitated wirelessly, for example using multi-carrier modulation or other carrier and modulation techniques, in which an underlying radio channel may be divided into different channels using radio frame structures to enable transmission of multiple data streams.

As one example, a radio frame may consist of a multitude of OFDM symbols that are modulated and encoded. Subcarriers of each ODFM symbol may be further assigned between multiple users to enable multiple access, which is known as orthogonal frequency division multiple access (OFDMA). The number of OFDM symbols per radio frame may be determined by the choice of a particular OFDM configuration which may vary according to sub-carrier spacing, cyclic prefix length, sampling frequency and/or other factors. Depending on the bandwidth and sampling frequency (or over-sampling factor in IEEE 802.16-2005), different configurations may be specified, resulting in different numbers of OFDM symbols in a radio frame. The modulation and coding scheme (MCS) for the subcarriers is then typically selected based on the channel condition.

In conventional wireless systems, the physical layer frame structure is agnostic to the type of application data being carried over the link. It is not optimized to the traffic it is serving which may lead to inefficient resource utilization and suboptimal capacity. While there may be different priorities for different traffic types and modulation and coding may be dynamically selected on a per frame basis, conventional wireless systems generally utilize physical layer frame structures that have the following properties:

1.) They use a single MCS over a complete frame; and
2.) The error detection mechanism utilized detects errors over the complete frame, without distinction between critical errors and non critical errors.

The above-mentioned legacy frame structures are very suitable for data applications, such as FTP, web browsing, etc...., for which 100% data integrity is required for proper application behavior. While theses conventional frame structures can be, and currently are, applied for use in VoIP applications, this use does not take advantage of the error concealment and error resiliency of VoIP applications (or in general any loss tolerant applications). Therefore, current wireless resource usage for loss tolerant applications is inefficient and wasteful.

In embodiments of the present invention, a radio frame structure may be dynamically optimized based, at least in part, on the type of application data being sent over the radio link. In this manner resource usage may be better optimized and system capacity increased.

Thus, according to the inventive embodiments, a frame may be adapted based, at least in part, on the characteristics of the application for which the frame data is to be utilized. Accordingly, resource utilization may be increased via an adaptive frame structure (AFS) mechanism of the inventive embodiments. By way of example, according to various embodiments of the present invention, an AFS mechanism may be capable of:

Differentiating between lossless and loss tolerant application data;
Customizing a packet to application payload;
Varying Modulation and Coding Schemes for different portions of the same frame;
Applying Unequal Error Protection; and/or
Applying Error Masking Referring to FIGS. 2 and 3, two example frame structures 200, 300 are illustrated. The sectional components (e.g., cyclic redundancy check (CRC), headers and payloads) of the frame structures 200, 300 may be similar to conventional structures however the MCS, CRC and/or error masking for respective frames 200, 300 may be dynamically selected depending on the type of application that will use the data payload.

Figure 2:
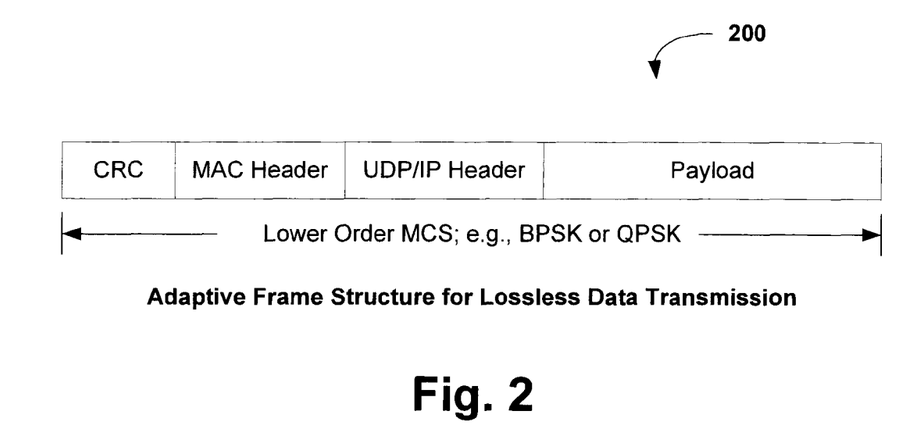
FIG. 2 is a diagram of an adaptive frame structure for a first application data type according to various embodiments of the present invention.
Figure 3:
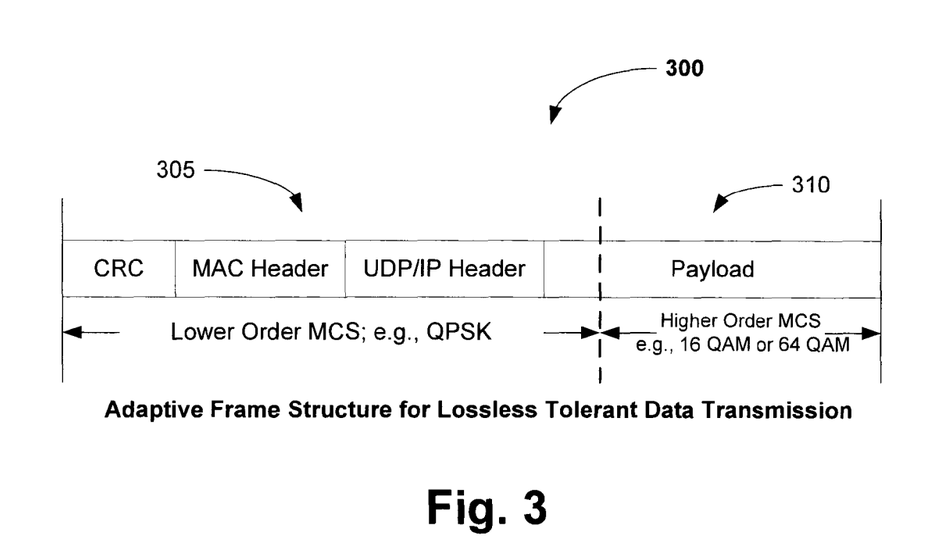
FIG. 3 is a diagram of an adaptive frame structure for a second application data type.

By way of example, FIG. 2 shows a frame 200 for lossless data transmission. In this case, the entirety of frame 200 requires high error protection, and thus a single MCS scheme (e.g., binary or quadrature phase shift keying (BPSK or QPSK)) and error detection/correction may be applied throughout the frame, where the occurrence of a single uncorrectable error would render the frame useless and be discarded. In contrast, FIG. 3 shows an example frame 300 which carries data for a more loss tolerant application. In this case, at least a portion of the frame 300 (e.g., a portion of data payload for VoIP application) can have a low error protection region 310 where errors are allowed and tolerated and thus a higher order MCS (e.g., quadrature amplitude modulation (QAM)-16) may be utilized. However, in the example of FIG. 3, the CRC and header portions of frame 300 may still be a high error protection region 305 which utilizes a lower order MCS (for higher error protection) to ensure proper decoding and routing, where the occurrence of a single uncorrectable error in this region would render the frame useless and be discarded. This results in an unequal error protection scheme throughout frame 300. In some embodiments, a receiver may utilize a critical error detection mechanism to detect errors in the high error protection region(s) 305 as well as an optional non-critical error detection mechanism to detect errors in low error protection region 310.

Figure 4:
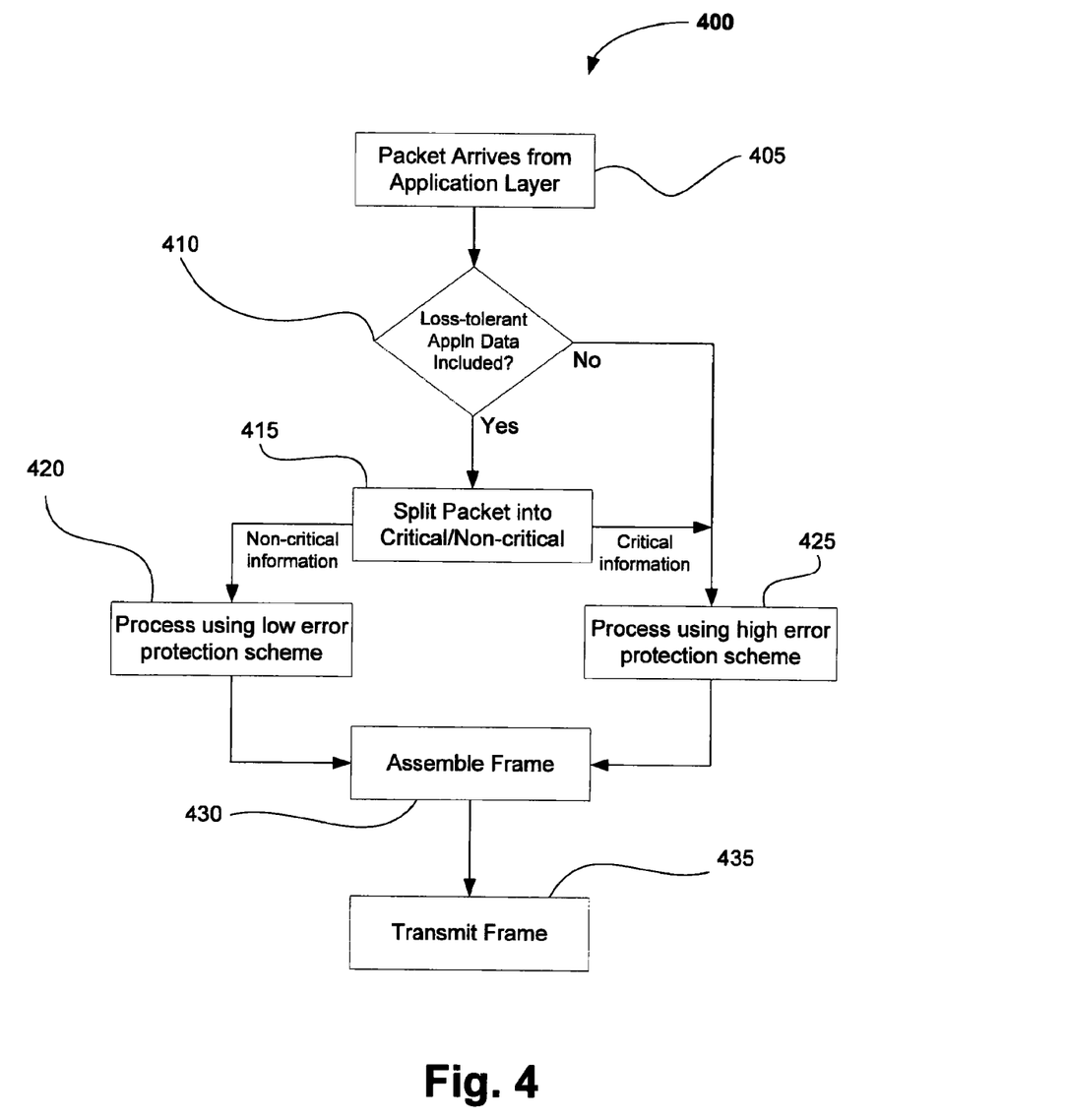
FIG. 4 is a flow diagram of a process for dynamic frame processing at a transmitter according to inventive embodiments.

Referring to FIG. 4, an exemplary process 400 for a transmitter to generate an adaptive frame structure according to the inventive embodiments may generally include determining 410 whether a packet received 405 from the application layer (or other upper layer) includes loss tolerant application data. If 410 no loss tolerant application data is included in the packet, a radio frame is processed 425 and assembled 430 using only a high error protection scheme and the frame is transmitted 435 as normal. If 410 however, it is determined that loss tolerant application data is present in the packet, the packet may be separated 415 into critical (e.g., CRC and header info) and non-critical (e.g., loss tolerant application data) information segments. The non-critical information may then be processed 420 using a low error protection scheme with higher MCS and the critical information may be processed 425 using a high error protection scheme with a lower MCS and combined 430 into a frame for transmission 435.

Figure 5:
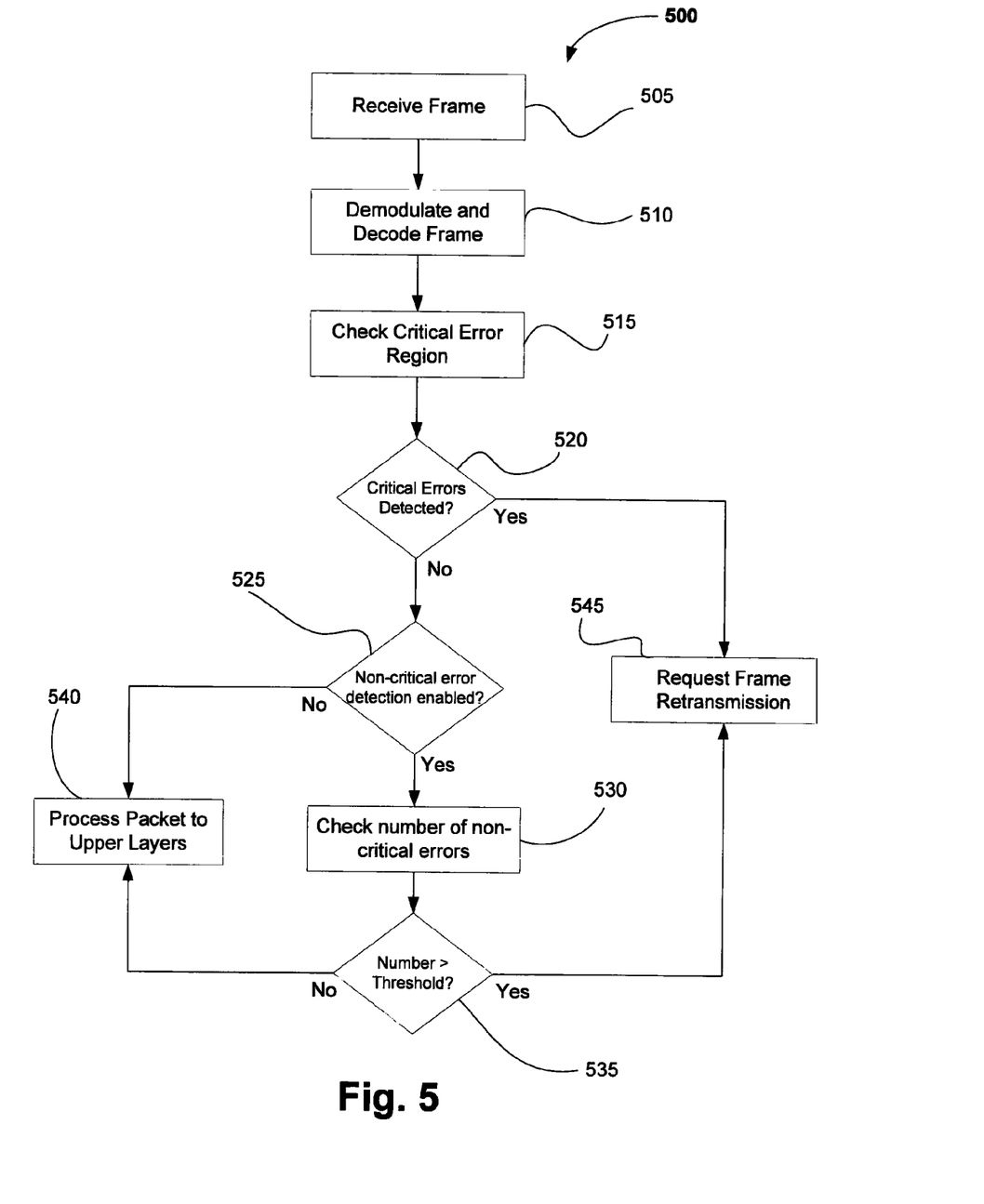
FIG. 5 is a flow diagram of a process for dynamic frame processing at a receiver according to inventive embodiments.

FIG. 5 shows an exemplary process 500 at the receiver to demodulate and decode the adaptive frame structure of the inventive embodiments. Process 500 may generally include demodulating and decoding 510 a received 505 radio frame and determining 515 if any critical errors are identified. For a legacy frame structure or an AFS containing application data which is not loss tolerant (e.g., frame 200; FIG. 2), the entire frame would be checked for critical errors (e.g., using the CRC and/or other error checking techniques) at step 515 and if 520 any critical errors are detected, a retransmission of the frame would be requested 545 (for example, through a hybrid automatic repeat request (HARQ) or through resending the complete frame). Alternatively, for a frame having unequal error protection regions (e.g., frame 300; FIG. 2), only the critical region 305 might be checked for critical errors to determine if retransmission 545 is necessary. If 520, no critical errors are detected the decoded frame data may be passed to an upper layer (e.g. data link layer or application layer) for further processing 540.

In an optional embodiment of the invention, the non-critical region(s) of the demodulated and decoded frame may also be checked 525, 530 for errors. In this optional embodiment, if 535 the number of errors in the non-critical region exceeds a threshold value, which may be set at the discretion of a network designer, a request 545 for frame retransmission would be sent. Otherwise, if 535, the number of errors detected in the non-critical region(s) is at or below an acceptable value, then the decoded frame data would be sent for processing 540 by upper OSI layers.

Using the Adaptive Frame Structure enables aggressive use of higher order MCS schemes for loss tolerant applications, which reduces the number of used resources in the physical layer. Additionally, due to the error masking feature in the low error protection region (i.e. some errors in the low error protection region are allowed to propagate up the stack), the number of retransmissions may be reduced, also providing savings in resources.

Embodiments of the present invention can be potentially used in wireless networks supporting a mixture of traffic comprising of loss tolerant applications and lossless applications. By deploying client devices that support adaptive frame structures of the present invention, a network will be able to support a higher number of client-devices in comparison to using client-devices that do not support AFSs. Additionally, the reduction in the number of transmissions introduced by using AFSs may reduce power consumption at the client-card and thus prolong battery life.

Figure 6:
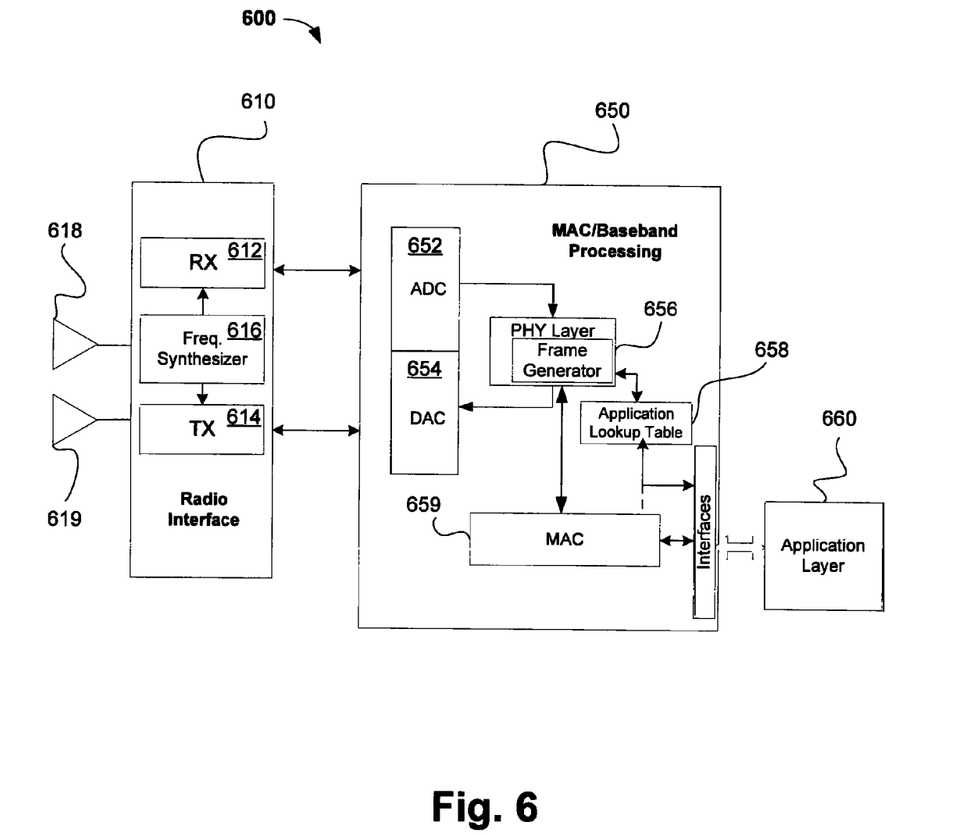
FIG. 6 is a diagram of an example wireless communication device according to an embodiment of the present invention.

Referring to FIG. 6, an apparatus 600 for use in a wireless network may include a processing circuit 650 including logic (e.g., hard circuitry, processor and software, or combination thereof) to determine the application type for which corresponding data units are sent/received and dynamically adjust unequal error protection per frame as described in one or more of the processes above. In certain non-limiting embodiments, apparatus 600 may generally include a radio frequency (RF) interface 610 and a medium access controller (MAC)/baseband processor portion 650.

In one example embodiment, RF interface 610 may be any component or combination of components adapted to send and receive single carrier or multi-carrier modulated signals (e.g., CCK or OFDM) although the inventive embodiments are not limited to any specific over-the-air interface or modulation scheme. RF interface 610 may include, for example, a receiver 612, a transmitter 614 and/or a frequency synthesizer 616. Interface 610 may also include bias controls, a crystal oscillator and/or one or more antennas 618, 619 if desired. Furthermore, RF interface 610 may alternatively or additionally use external voltage-controlled oscillators (VCOs), surface acoustic wave filters, intermediate frequency (IF) filters and/or radio frequency (RF) filters as desired. Due to the variety of potential RF interface designs an expansive description thereof is thus omitted.

Processing circuit 650 may communicate with RF interface 610 to process receive/transmit signals and may include, by way of example only, an analog-to-digital converter 652 for down converting received signals, a digital-to-analog converter 654 for up converting signals for transmission. Further, circuit 650 may include a baseband processing circuit 656 for PHY link layer processing of respective receive/transmit signals. Processing portion 650 may also include or be comprised of a processing circuit 659 for medium access control (MAC)/data link layer processing.

In the inventive embodiments, the application type information from/to an application layer 660 may be looked up in a table 658 by MAC circuit 659 and/or by a frame generator in PHY circuit 656 (this information may also be deduced from the service flow and the packet size). The application type information is used to define the boundary between the high error protection region and low error protection region (thus customizing the frame structure to application requirements). In addition, this information may be signaled to the receiver side for proper demodulation and decoding of the frame in the physical layer.

Unequal error protection may be implemented by the MAC circuit 659 and/or frame generator in the PHY layer circuit 656 to set a high error protection region and a low error protection region within the same frame. In the high error protection region a lower order MCS is used while for the low error protection region a higher order MCS is used. A critical error detection mechanism is used to detect errors in the high error protection region, should an error be detected in that region, additional transmissions are required. The low error protection region can be optionally checked by an optional non-critical error detection mechanism, which provides information regarding the number of errors in the low error protection region. Should the optional non-critical error detection mechanism be employed, an additional decision to accept the frame or not is made based on the number of errors in the low error protection region as shown by exemplary process 500 in FIG. 5. Should this optional non-critical error detection mechanism not be used, then the decision to accept the frame or not is solely based on the integrity of critical error region (high error protection region).

In certain embodiments of the present invention, PHY processing circuit 656 may include a frame construction and/or detection module, in combination with additional circuitry such as a buffer memory (not shown), to construct and/or deconstruct super-frames as in the embodiments previously described. Alternatively or in addition, MAC processing circuit 659 may share processing for certain of these functions or perform these processes independent of PHY processing circuit 656. MAC and PHY processing may also be integrated into a single circuit if desired.

Apparatus 600 may be, for example, a base station, an access point, a hybrid coordinator, a wireless router, a NIC and/or network adaptor for computing devices, a mobile station or other device suitable to implement the inventive methods, protocols and/or architectures described herein. Accordingly, the previously described functions and/or specific configurations of apparatus 600 could be included or omitted as suitably desired. In some embodiments apparatus 600 may be configured to be compatible with protocols and frequencies associated one or more of the IEEE 802.11, 802.15 and/or 802.16 standards for respective WLANs, WPANs and/or broadband wireless networks, although the embodiments are not limited in this respect.

Embodiments of apparatus 600 may be implemented using single input single output (SISO) architectures. However, as shown in FIG. 6, certain preferred implementations may include multiple antennas (e.g., 618, 619) for transmission and/or reception using adaptive antenna techniques for beamforming or spatial division multiple access (SDMA) and/or using multiple input multiple output (MIMO) communication techniques.

The components and features of station 600 may be implemented using any combination of discrete circuitry, application specific integrated circuits (ASICs), logic gates and/or single chip architectures. Further, the features of apparatus 600 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example apparatus 600 shown in the block diagram of FIG. 6 represents only one functionally descriptive example of many potential implementations. Accordingly, division, omission or inclusion of block functions depicted in the accompanying figures does not infer that the hardware components, circuits, software and/or elements for implementing these functions would be necessarily be divided, omitted, or included in embodiments of the present invention.

Unless contrary to physical possibility, the inventors envision the methods described herein: (i) may be performed in any sequence and/or in any combination; and (ii) the components of respective embodiments may be combined in any manner.

Although there have been described example embodiments of this novel invention, many variations and modifications are possible without departing from the scope of the invention. Accordingly the inventive embodiments are not limited by the specific disclosure above, but rather should be limited only by the scope of the appended claims and their legal equivalents.

The invention claimed is:

1. A method for sending voice over Internet Protocol (VoIP) information over a wireless broadband access communications channel, the method comprising:

generating an orthogonal frequency division multiple access (OFDMA) frame structure for transmission over the wireless broadband access communications channel, the frame structure having a first data region and a second data region, wherein the first data region includes a cyclic redundancy check (CRC) modulated with a first modulation and coding scheme (MCS) and header information modulated with the first MCS, and wherein the second data region uses no CRC and includes only VoIP payload data associated with the header information in the first data region, and the second data region is modulated with a second MCS of higher order than the first MCS; and retransmitting the entire frame comprising the first data region and the second data region after receiving a request from a receiving device receiving the OFDMA frame that determines a critical error is presented in the first data region.

2. The method of claim 1 wherein the first data region is modulated using binary phase shift keying (BPSK) or quadrature phase shift keying (QPSK) and wherein the second data region is modulated using 16 quadrature amplitude modulation (QAM) or 64 QAM.

3. A method of receiving information for a single type of application data in a wireless broadband access network, the method comprising:

demodulating and decoding at least a portion of a received orthogonal frequency division multiple access (OFDMA) physical layer frame having a first data region and a second data region, wherein the first data region includes a cyclic redundancy check (CRC) modulated with a first modulation and coding scheme (MCS) and header information modulated with the first MCS, and wherein the second data region uses no CRC and includes only payload data pertaining to the single type of application data and associated with the header information in the first data region, and the second data region is modulated with a second MCS of higher order than the first MCS; and determining if any critical errors are present in the first region using the CRC and if so, requesting the entire frame comprising the first data region and the second data region to be retransmitted.

4. The method of claim 3 further comprising, when no critical errors are determined to be present in the first region, determining a number of errors, if any, present in the second region, comparing the number of errors to a threshold value, and requesting the frame to be retransmitted if the number exceeds the threshold value.

5. The method of claim 3, wherein the first region further includes a critical portion of the payload data, if any, and wherein the second region includes non-critical portions of the payload data.

6. The method of claim 5 wherein the second MCS has a modulation order higher than the first MCS and wherein the single type of application data relates to a loss tolerant application program.

7. The method of claim 6 wherein the loss tolerant application program comprises a voice over Internet protocol (VoIP) application or an internet video application program.

8. The method of claim 3 wherein the wireless broadband access network comprises a WiMAX network.

9. A device to generate and send radio frames including voice over Internet protocol (VoIP) data in a broadband wireless access network, the device comprising:

a frame generator circuit to generate and digitally modulate an orthogonal frequency division multiple access (OFDMA) frame for transmission of the VoIP data, the frame having a first data region and a second data region, wherein the first data region includes a cyclic redundancy check (CRC) modulated with a first modulation and coding scheme (MCS) and header information modulated with the first MCS, and wherein the second data region uses no CRC and consists of only VoIP payload data, and the second data region is modulated with a second MCS of higher order than the first MCS; and wherein the frame generator circuit is configured to retransmit the entire frame comprising the first data region and the second data region after receiving a request from a receiving device receiving the OFDMA frame that determines a critical error is present in the first region.

10. The device of claim 9 further comprising a radio interface coupled to the frame generator circuit, the radio interface including at least two antennas for multiple-input multiple-output transmission and reception.

* * * * *